(12) United States Patent
Hielscher et al.

(10) Patent No.: US 11,075,591 B2
(45) Date of Patent: Jul. 27, 2021

(54) DEVICE FOR INTEGRATING ELECTRIC CONDUCTORS INTO LOW-FREQUENCY ELECTRIC TANK CIRCUITS

(71) Applicant: DR. HIELSCHER GMBH, Teltow (DE)

(72) Inventors: Harald Hielscher, Stahnsdorf (DE); Thomas Hielscher, Potsdam (DE); Holger Hielscher, Teltow (DE)

(73) Assignee: DR. HIELSCHER GMBH, Potsdam (DE)

(*) Notice: Subject to any disclaimer, the term of this patent is extended or adjusted under 35 U.S.C. 154(b) by 575 days.

(21) Appl. No.: 15/968,232

(22) Filed: May 1, 2018

(65) Prior Publication Data
US 2018/0323728 A1 Nov. 8, 2018

Related U.S. Application Data

(60) Provisional application No. 62/500,165, filed on May 2, 2017.

(51) Int. Cl.
*H02N 2/00* (2006.01)
*H01L 41/04* (2006.01)

(52) U.S. Cl.
CPC ............ *H02N 2/008* (2013.01); *H01L 41/042* (2013.01)

(58) Field of Classification Search
CPC .............................. H02N 2/008; H01L 41/042
See application file for complete search history.

(56) References Cited

U.S. PATENT DOCUMENTS

| | | | |
|---|---|---|---|
| 7,798,591 B2* | 9/2010 | Ishizaki | B41J 2/0455 347/14 |
| 8,986,302 B2* | 3/2015 | Aldridge | A61B 18/1233 606/42 |
| 10,276,344 B2* | 4/2019 | Sung | H01J 37/32174 |
| 10,728,997 B2* | 7/2020 | Shiohara | H01L 41/107 |
| 2016/0126754 A1* | 5/2016 | Ichikawa | H02J 7/025 307/104 |
| 2017/0054387 A1* | 2/2017 | Sumioka | H02N 2/008 |
| 2018/0219423 A1* | 8/2018 | Maunder | H01F 38/14 |

* cited by examiner

*Primary Examiner* — Emily P Pham
(74) *Attorney, Agent, or Firm* — Norris McLaughin P.A.

(57) ABSTRACT

The invention pertains to a device for at least one low-frequency electric tank circuit, in which at least one electric conductor is an influencing component of the tank circuit due to its properties.

15 Claims, 2 Drawing Sheets

DEVICE FOR INTEGRATING ELECTRIC CONDUCTORS INTO LOW-FREQUENCY ELECTRIC TANK CIRCUITS

FIELD OF THE INVENTION

The invention pertains to a device for at least one low-frequency electric tank circuit, in which at least one electric conductor is an influencing component of the tank circuit due to its properties.

TECHNOLOGICAL BACKGROUND

A tank circuit is a resonant circuit that generates sufficient output power for driving a considerable external load.

An electric resonant circuit is a resonant electric circuit that consists of a coil (component L) and a capacitor (component C) and can carry out electrical oscillations. In this LC circuit, energy is periodically exchanged between the magnetic field of the coil and the electric field of the capacitor such that a high current or a high voltage is alternately present. The frequency, with which this periodically repeats itself in the undisturbed state, is $$f_0 = \frac{1}{2 \cdot \pi \cdot \sqrt{L \cdot C}}$$

wherein L represents the inductance of the coil and C represents the capacitance of the capacitor. This equation is called Thomson's oscillation equation.

Once a resonant circuit has been triggered by a switching process or a pulse, it carries out free oscillations (natural oscillations), which in reality subside after a certain period of time due to losses. However, if the resonant circuit is periodically excited, it also carries out periodic forced oscillations, the frequency of which is identical to the excitation frequency, after the expiration of the settling time. The resonance phenomena occurring in the process are of paramount importance for practical applications.

With respect to a resonant circuit with external excitation, one distinguishes between a parallel resonant circuit (L parallel to C) and a series resonant circuit (L in series with C) depending on the arrangement relative to the excitation source.

Electric conductors have a low electrical resistance that can be calculated in accordance with the law of resistance. Almost all metals, particularly silver, copper, gold, lead and aluminum, are sound electric conductors. Molten metals, plasma and liquids such as water are also electric conductors. Superconductors, in which the electrical resistance is zero, are very good electric conductors. The shape of the electric conductor (line) is preferably defined, e.g. in the form of a wire.

Multiple wires form a stranded conductor. A single-wire or multi-wire assembly of individual lines (wires), which is sheathed with insulating materials, forms a cable. The individual lines may consist of wires or stranded conductors.

Each cable has at least one capacitance, at least one inductance and at least one resistance (see for example FIG. 1).

A cable consists of at least two conductors.

Examples of different cable types are single pairs, ribbon cables, twisted pairs, shielded twisted pairs, multicore cables and coaxial cables.

SUMMARY OF INVENTION

The invention is based on the objective of making available a device for at least one low-frequency electric tank circuit, in which at least one electric conductor is an influencing component of the tank circuit due to its properties (in particular, basic generator and consumer circuit with long line: see FIG. 4).

The electric conductor is located between the generator and the consumer.

In very short lines, the electric conductor between the generator and the consumer can be neglected as influencing component of the tank circuit (in particular basic generator and consumer circuit with short line: see FIG. 3).

The low-frequency electric tank circuit has a frequency in the range between 500 Hz and 2,000,000 Hz, preferably between 2000 Hz and 800,000 Hz, e.g. 20,000 Hz.

The low-frequency electric tank circuit is periodically excited with an electrical oscillation, a switching process or a pulse by means of a generator. The frequency of the periodic excitation lies at or near the frequency of the low-frequency electric tank circuit. The maximum deviation lies in the range between 500 Hz and 10,000 Hz, preferably between 800 Hz and 2000 Hz, e.g. at 1000 Hz.

At least two low-frequency electric tank circuits may be coupled to one another. The maximum deviation between the individual tank circuits lies in the range between 500 Hz and 10,000 Hz, preferably between 800 Hz and 2000 Hz, e.g. at 1000 Hz.

A consumer is coupled to at least one high-frequency electric resonant circuit.

The consumer may be a high-frequency electric resonant circuit.

The consumer may be a magnetostrictive actuator or a piezo actuator, preferably a piezo actuator. An equivalent circuit diagram of the piezo actuator is illustrated in FIG. 2.

The transmitted effective power at the consumer lies in the range between 5 W and 50,000 W, preferably between 500 W and 20,000 W, e.g. at 1000 W.

The transmitted effective power at the generator lies in the range between 5 W and 50,000 W, preferably between 500 W and 20,000 W, e.g. at 1000 W.

The electric conductor serves for the transport of charged particles. This transport is referred to as electrical current. The transport distance (from the beginning A to the end B) lies in the range between 1 cm and 10,000 km, preferably between 5 cm and 10,000 m, e.g. at 1500 m.

The equivalent circuit of an electric line consists of capacitances, inductances and resistances (see FIG. 1).

The complex resistance Z of the cable lies in the range between 1 Ohm and 1000 Ohm, preferably between 20 Ohm and 70 Ohm, e.g. at 50 Ohm.

The cable as influencing component of the tank circuit has the property of forming a resonant circuit with integrated transit time in dependence on the length of the cable.

The cable as influencing component of the tank circuit has the property of forming part of a resonant circuit with integrated transit time in dependence on the length of the cable.

The minimum spacing between two conductors lies in the range between 0.1 mm and 100 mm, preferably between 0.5 mm and 20 mm, e.g. at 10 mm.

At high frequencies, a terminal resistance ($R_a$ or $X_a$ or $Z_a$) is required for the line adaptation in order to reduce reflections (echoes) due to excess energy on lines.

The terminal resistance should almost correspond to the complex resistance of the line $Z_L'$.

The terminal resistance is an ohmic resistance $R_a$ in dependence on the tapping point.

The terminal resistance is a complex resistance $Z_a$ in dependence on the tapping point.

The terminal resistance is a resistance $X_a$, which results from the ohmic resistance and the complex resistance Z in dependence on the tapping point.

The terminal resistance lies in the range between 1Ω and 1000Ω, preferably between 5 and 500Ω, e.g. at 30Ω.

The consumer in the form of a piezo element has a maximum resistance of 2000 Ohm between the tapping points. At least one coil is connected in parallel to the consumer consisting of at least one piezo element. The inductance of the coil arrangement is adjustable or can be continuously or discontinuously selected.

At least one capacitance is connected in parallel to the consumer consisting of at least one piezo element. The capacitance of the capacitor arrangement is adjustable or can be continuously or discontinuously selected.

At least one low-frequency electric tank circuit, in which at least one electric conductor is an influencing component of the tank circuit due to its properties, makes it possible to feed back an electrical oscillation, a switching process or a pulse from the consumer in the form of a feedback loop in order to control the pulse width of the generator.

The voltage potential in at least one point between two conductors lies in the range between 50 V and 50,000 V, preferably between 100 V and 15,000 V, e.g. at 2000 V.

The line cross section lies in the range between 0.5 mm$^2$ and 500 mm$^2$, preferably between 1.5 mm$^2$ and 35 mm$^2$, e.g. at 10 mm$^2$.

The cable as influencing component of the tank circuit has the property of having an n*wavelength Lambda/4. In this case, n is an integer.

The cable is a Lambda/4 transformer.

A length-adapted cable syntonized to n*wavelength Lambda/4 is a Lambda/4 transformer.

The n*wavelength Lambda/4 results from the ideal n*wavelength Lambda/4 (relative permittivity $\varepsilon_r=1$) multiplied by the velocity factor and the adaptation factor.

The velocity factor is defined as the ratio of the signal speed on a line to the speed of light in vacuum. The signal speed is dependent on the relative permittivity $\varepsilon_r$ (f), which in turn is dependent on the frequency. In electrodynamics and also in electrostatics, the permittivity $\varepsilon$, which is also referred to as dielectric conductivity or dielectric function, specifies the transmissivity of a material for electric fields.

The adaptation factor is realized by means of at least one coil and/or at least one capacitor.

The temperature difference along the line (from the beginning A to the end B) lies in the range between 1 K and 500 K, preferably between 10 K and 200 K, e.g. at 80 K.

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE INVENTION

Reference will now be made in detail to embodiments, examples of which are illustrated in the accompanying drawings. Effects and features of the exemplary embodiments, and implementation methods thereof will be described with reference to the accompanying drawings.

Figure 1:
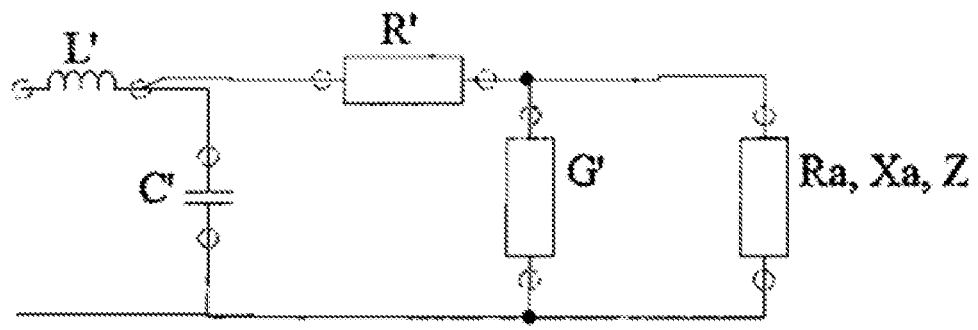
FIG. 1 illustrates an equivalent circuit diagram of a line.

FIG. 1 shows an equivalent circuit diagram line which may be used for long lines. The terminal resistance is Ra or Xa or Z.

Figure 2:
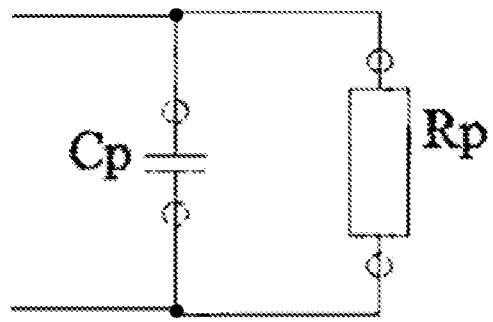
FIG. 2 illustrates an equivalent circuit diagram of piezo element.

FIG. 2 shows an equivalent circuit diagram of piezo element as a consumer.

Figure 3:
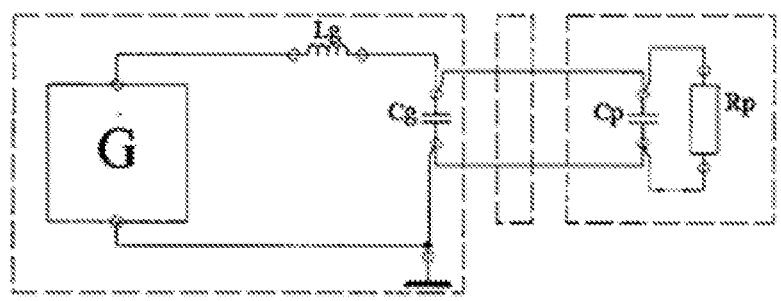
FIG. 3 illustrates a basic generator and a consumer circuit with short line.

FIG. 3 illustrates a generator with resonant circuit generator adaptation. The drawing shows a basic generator and a consumer circuit with short line. The consumer may be a piezo element.

Figure 4:
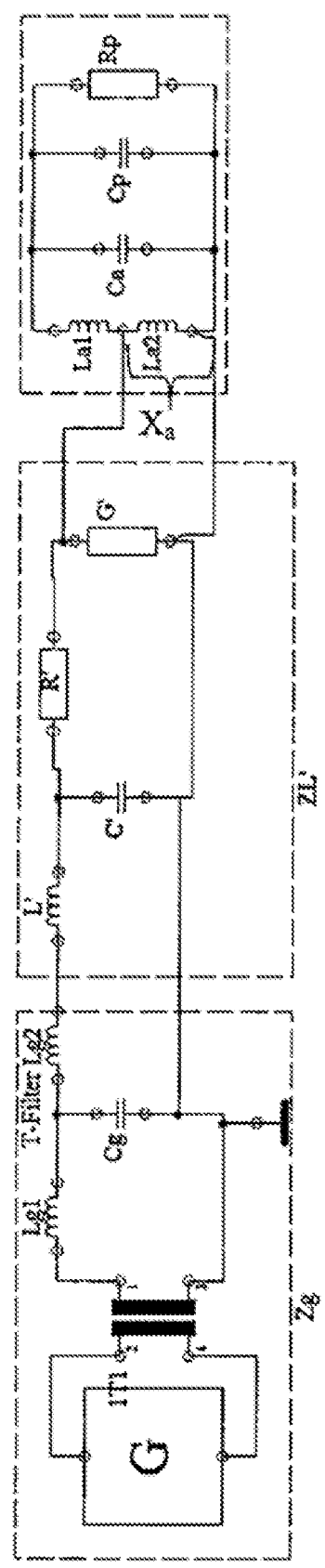
FIG. 4 illustrates basic generator and a consumer circuit with long line.

FIG. 4 shows a basic generator and a consumer circuit with long line. The generator may be a generator with T-filter adaptation. There is a frequency-adapted resonant circuit.

LIST OF REFERENCE SYMBOLS

| Formula Symbol | Designation |
|---|---|
| C | capacitance |
| C' | capacitance of line (length-dependent) |
| $C_A$ | adaption capacitance |
| $C_G$ | capacitance of generator |
| $C_P$ | capacitance of piezo element |
| G' | leakage resistance of line (length-dependent) |
| L | inductance |
| L' | inductance of line (length-dependent) |
| $L_A$ | adaption inductance |
| R | resistance |
| R' | resistance (length-dependent) |
| $R_A$ | terminal resistance |
| $R_L$ | load resistance |
| $R_P$ | resistance of piezo element |
| $X_A$ | resulting terminal resistance |
| Z | complex, system or wave resistance |
| $Z_A$ | complex terminal resistance |
| $Z_G$ | complex resistance of generator |
| $Z_L$ | complex resistance of line |

The invention claimed is:

1. A device comprising at least one low-frequency electric tank circuit and at least one electric conductor located between a generator and a consumer, the at least one electric conductor being an influencing component of the at least one low-frequency electric tank circuit due to its properties,
   wherein at least two low-frequency electric tank circuits are coupled to one another and a maximum deviation between the at least two low-frequency electric tank circuits lies in a range between 500 Hz and 10,000 Hz.

2. The device of claim 1, wherein the at least one low-frequency electric tank circuit has a frequency in a range between 500 Hz and 2,000,000 Hz.

3. The device of claim 1, wherein the at least one low-frequency electric tank circuit is adapted to be periodically excited with an electrical oscillation, a switching process, or a pulse by means of a generator and a frequency of a periodic excitation lies at or near a frequency of the at least one low-frequency electric tank circuit, wherein a maximum deviation lies in a range between 500 Hz and 10,000 Hz.

4. The device of claim 1, wherein a maximum deviation between the at least two low-frequency tank circuits lies in the range between 800 Hz and 2000 Hz.

5. The device of claim 1, wherein the consumer is a high-frequency electric resonant circuit, a magnetostrictive actuator, or a piezo actuator.

6. The device of claim 1, wherein a transmitted effective power at the consumer lies in a range between 5 W and 50,000 W.

7. The device of claim 1, wherein a transmitted effective power at the generator lies in a range between 5 W and 50,000 W.

8. The device of claim 1, wherein the at least one electric conductor is a cable and a complex resistance Z of the cable lies in a range between 1 Ohm and 1000 Ohm.

9. The device of claim 8, wherein the cable as influencing component of the at least one low-frequency electric tank circuit has the property of forming a resonant circuit with integrated transit time in dependence on the length of the cable.

10. The device of claim 1, wherein a terminal resistance is an ohmic resistance $R_a$ in dependence on a tapping point, a complex resistance Z in dependence on the tapping point, or a resistance $X_a$, which results from the ohmic resistance $R_a$ and the complex resistance Z in dependence on the tapping point.

11. The device of claim 10, wherein the terminal resistance lies in a range between 1 Ohm and 1000 Ohm.

12. The device of claim 1, wherein a voltage potential in at least one point between two conductors lies in a range between 50 V and 50,000 V.

13. The device of claim 1, wherein a line cross section lies in a range between 0.5 $mm^2$ and 500 $mm^2$.

14. The device of claim 1, wherein a cable as influencing component of the at least one low-frequency electric tank circuit has the property of having an n* wavelength Lambda/4, wherein n is an integer.

15. The device of claim 14, wherein the cable is a Lambda/4 transformer.

* * * * *